United States Patent
Katagiri et al.

(10) Patent No.: US 6,849,542 B2
(45) Date of Patent: Feb. 1, 2005

(54) METHOD FOR MANUFACTURING A SEMICONDUCTOR DEVICE THAT INCLUDES PLANARIZING WITH A GRINDSTONE THAT CONTAINS FIXED ABRASIVES

(75) Inventors: Soichi Katagiri, Kodaira (JP); Ui Yamaguchi, Saitama (JP); Seiichi Kondo, Tsukuba (JP); Kan Yasui, Kodaira (JP); Masahiro Kaise, Kuroiso (JP); Minoru Honda, Osaka (JP)

(73) Assignees: Hitachi, Ltd., Tokyo (JP); Nippon Tokushu Kent Co., Ltd., Kyoto (JP)

( * ) Notice: Subject to any disclaimer, the term of this patent is extended or adjusted under 35 U.S.C. 154(b) by 43 days.

(21) Appl. No.: 10/272,831

(22) Filed: Oct. 18, 2002

(65) Prior Publication Data

US 2003/0077906 A1 Apr. 24, 2003

(30) Foreign Application Priority Data

Oct. 18, 2001 (JP) ........................................ 2001-320289

(51) Int. Cl.⁷ ............................................ H01L 21/463
(52) U.S. Cl. ........................................ 438/645; 438/693
(58) Field of Search ................................. 438/645, 675, 438/690, 691, 692, 693; 451/72

(56) References Cited

U.S. PATENT DOCUMENTS 6,069,080 A * 5/2000 James et al. ................. 438/691
6,206,759 B1 * 3/2001 Agarwal et al. ............... 451/41
6,346,032 B1 * 2/2002 Zhang et al. .................. 451/41
6,390,895 B1 * 5/2002 Katagiri et al. ............... 451/56
6,498,101 B1 * 12/2002 Wang .......................... 438/691
6,524,961 B1 * 2/2003 Katagiri et al. ............. 438/691
6,602,117 B1 * 8/2003 Chopra et al. ................ 451/65
6,602,436 B2 * 8/2003 Mandigo et al. ............... 216/88

FOREIGN PATENT DOCUMENTS

JP        2000049122 A   *  2/2000   ......... H01L/21/304
JP        2001047360 A   *  2/2001   ........... B24B/37/04

* cited by examiner

Primary Examiner—Stephen W. Smoot
(74) Attorney, Agent, or Firm—Antonelli, Terry, Stout & Kraus, LLP

(57) ABSTRACT

The invention provides a method for manufacturing a semiconductor device with reduced dishing and erosion. In this method for manufacturing a semiconductor device, the convex/concave pattern is planarized by relatively moving a substrate having the convex/concave pattern on the surface and a polishing tool with pressing the convex/concave surface of the substrate on the polishing tool. The polishing tool is provided with a grindstone 10 having a plurality of polygonal segments 20, which comprises abrasive 23 that is bonded together with resin 24 and contains pores 22. The polygonal segments are arranged so that corners of three or more polygonal segments are not located near each other.

17 Claims, 9 Drawing Sheets

METHOD FOR MANUFACTURING A SEMICONDUCTOR DEVICE THAT INCLUDES PLANARIZING WITH A GRINDSTONE THAT CONTAINS FIXED ABRASIVES

BACKGROUND OF THE INVENTION

1. Field of the Invention

This invention relates to polishing and grinding technique for planarization of the substrate surface and a semiconductor device manufacturing apparatus that uses such planarization technique, and more particularly relates to a manufacturing method of a semiconductor device for polishing or grinding a thin film formed on a semiconductor substrate and a manufacturing apparatus of a semiconductor device.

2. Description of the Prior Art

In recent years, planarization technique for shallow trench isolation, for forming of a tungsten (W) plug that is served for transmitting a signal from a transistor element to a wiring layer, and for forming of a wiring layer has been important. The polishing technique called as chemical mechanical polishing is typically employed in the field of planarization technique.

In the field of planarization technique, copper has been used popularly as the wiring material. The damascene method has been employed mainly as the planarization technique. For example, Japanese Patent Laid-open No. Hei2-278822 and Japanese Patent Laid-open No. Hei8-83780 disclose such polishing technique.

Copper wiring material is advantageous in that the durability is improved and the resistance value is reduced in comparison with the conventional aluminum wiring material, but on the other hand, disadvantageous in that the insulation is poor due to conductive copper ions that diffuse into the oxide film. The poor insulation should be avoided. In damascene method, a barrier metal film 14 formed on the interface between an oxide film 13 and the copper wiring material 15 prevents copper ions from being diffused as shown in FIG. 11A. In the damascene method, the barrier metal film 14 allows the copper 15 to be filled in the trench through the process including A step to C step shown in FIG. 11A to FIG. 11C.

For the copper wiring forming process in the damascene method, the control of the removal rate of the copper 15 and barrier metal film 14 is important. The term "removal rate" means the removed quantity of a target material per unit time. Generally, because the removal rate of a barrier metal film (Ta, or TaN is used usually) is slower than that of copper, the copper is removed excessively when the process of the step A to step C is carried out all at once. To avoid the problem, in the usual slurry working, a plurality of slurries including a slurry that polishes copper at high removal rate, a slurry that polishes a barrier metal film at high removal rate and polishes copper at low removal rate, and a slurry that polishes copper, barrier metal film, and oxide film at the same removal rate are used separately. In the actual CMP process, the step A shown in FIG. 11 is carried out by use of the slurry that polishes copper at high removal rate, and then the next step is carried out by use of the slurry that polishes a barrier metal film with changing a polishing platen. In some cases, to improve the planarity and reduce the scratch, the additional CMP is carried out by use of the slurry that polishes copper, barrier metal film, and oxide film at the same removal rate.

Otherwise, another conventional technique in which fixed abrasive 12 is used for planarization of copper has been employed. A sheet on which alumina abrasive is fixed with resin is used. This technique is characterized in that slurry containing free abrasive 16 is not required. However, this technique also still requires the second and third step CMP as in the above-mentioned technique for removing the barrier metal film 14. This technique is described in "2000 Chemical Mechanical Planarization for ULSI Multilevel Interconnection Conference proceedings pp. 58 to 65.

Furthermore, another conventional technique in which fixed abrasive is used is described in U.S. Pat. No. 5,972,792 exemplarily. In this technique, planarization is carried out while pH of the polishing liquid 8 is controlled to prevent a target material from being etched. This technique also belongs to the multi-step planarization method in which polishing method is changed for each target material by use of fixed abrasive.

Furthermore, Japanese Patent Laid-open No. Hei10-329031 and Japanese Patent Laid-open No. 2000-233375 disclose a polishing technique in which a grindstone containing pores is used. Such grindstone is manufactured by use of, for example, thermosetting resin that is self-foamable or rendered foamable with foaming agent. Furthermore, the above-mentioned Japanese Patent Laid-open No. 2000-233375 discloses a polishing technique in which a grindstone having arranged small segmented grindstones.

The above-mentioned damascene methods for planarization by means of CMP is involved in some problems. One of them is that separate two or more steps of CMP are necessary for CMP of copper and barrier metal film because Ta or TaN, which is used for the barrier metal film, is harder than copper as described hereinbefore, and the multi-step CMP results in increased cost, low through-put, and increased environmental load due to increased waste slurry.

Furthermore, the softness of a polishing pad results in dishing or erosion as shown in FIG. 11A to FIG. 11C and FIG. 5, which means the concave forming on the wiring surface, and the dishing or erosion further resultantly causes increased dispersion of wiring resistance value. Particularly the above-mentioned problem is serious for the logic device called as system LSI having multi-layer wiring structure as shown in FIG. 8. In detail, if the planarity of the bottom layer is poor as shown in FIG. 7, the planarization is more insufficient than expected for CMP, and the short-circuit or disconnection due to insufficient polishing is apt to occur. The above-mentioned problems have remained unsolved. The detail of the problems is described in "Next Generation ULSI Multi-Layer Wiring New Material/Process Technology" pp. 242 to 246 by Technical Information Association.

It is the first object of the present invention to provide a method for manufacturing a semiconductor device with less dishing or erosion.

It is the second object of the present invention to provide an apparatus for manufacturing a semiconductor device with less dishing or erosion.

It is the third object of the present invention to provide a method for manufacturing a semiconductor device and an apparatus for manufacturing a semiconductor device through one step process instead of conventional process comprising two or more steps.

SUMMARY OF THE INVENTION

To achieve the first object, a method for manufacturing a semiconductor device according to the present invention comprises a step for forming a first conductive film on an aperture of an insulation film provided on a substrate and on the insulation film surface, a step for forming a second conductive film on the first conductive film, and a step for grinding the portion of the second conductive film and the first conductive film by use of a grindstone with reserving the first conductive film and the second conductive film in the aperture residually, wherein the grindstone comprises abrasive that is bonded together with resin and contains pores.

The compressive elastic modulus of the grind stone in accordance with the present invention is preferably in a range from 200 MPa to 3 GPa, and more preferably in a range from 500 MPa to 1 GPa. The compressive elastic modulus that is smaller than 200 MPa is not so different from that of a CMP polishing pad, and causes dishing or erosion because it is too soft. On the other hand, the compressive elastic modulus that exceeds 3 GPa causes increased scratch generation frequency because it Is too hard.

The porosity is preferably in a range from 35 to 75%, and more preferably in a range from 50 to 70%. The porosity that is smaller than 35% results in dulling even though polishing is carried out with dressing because the porosity is too small, and results in reduced removal rate and generation of scratching. On the other hand, the porosity that exceeds 75% results in very low removal rate because the percentage of resin that functions as bonding material is too low and the percentage of abrasive is too low. The low abrasive percentage results in very low removal rate and the low resin percentage results in insufficient tensile breaking strength undesirably.

The tensile breaking elongation is preferably in a range from 0.2 to 1.5%, and more preferably 0.5 to 0.9%. The tensile breaking strength is preferably in a range from 0.5 to 5.0 MPa, and more preferably in a range from 1.0 to 2.5 MPa. The tensile breaking elongation that is smaller than 0.2% or the tensile breaking strength that is smaller than 0.5 MPa results in too brittle grindstone that causes partial chipping during polishing. The partial chipping causes generation of scratching unpreferably. On the other hand, the tensile breaking elongation that exceeds 1.5% or the tensile breaking strength that exceeds 5.0 MPa results in extremely slight wearing of the grindstone during polishing that causes no self-generation of edge of abrasive and the grindstone becomes dull because the grindstone is too strong.

Polyester base resin or polyimide base resin is used preferably as the resin used in the present invention. Other resins, for example epoxy resin, are not resistant to chemicals such as hydrogen peroxide and oxygen, and not durable practically. Use of polyester base resin or polyimide base resin that is resistant to chemicals such as hydrogen peroxide and oxygen brings about realization of the property that is suitable for the present invention. If a grindstone having the property that is similar to the above-mentioned property is manufactured by use of another resin, the excellent removal rate that is the characteristic of the grindstone containing polyester base resin or polyimide base resin cannot be obtained because the micro holding power for holding fine abrasive of a grindstone formed of the resin is poor in comparison with the holding power of the grindstone formed of polyester base resin or polyimide resin.

The average particle diameter of abrasive is preferably in a range from 10 nm to 100 nm. The planarization is preferably carried out with supplying polishing liquids 8 and 9, that are different from each other, from at least two polishing liquid supplying systems 6 and 7 respectively, which different polishing liquids 8 and 9 have the same composition, but have different contents of at least any one component contained in the composition from each other.

To achieve the first object, a method for manufacturing a semiconductor device according to the present invention involves a process for planarizing a convex/concave pattern by means of relative motion between a polishing tool and a substrate having the convex/concave pattern on the surface on which at least a portion of a semiconductor element is formed with pressing the convex/concave pattern on the polishing tool, wherein the method is characterized in that the polishing tool comprises a grind stone provided with a plurality of arranged polygonal segments that are smaller than the substrate and that are arranged so that corners of three or more polygonal segments are not located near each other.

The segments fixed on a base plate may be used, or the segments fixed on a base plate with interposition of a cushion 43 formed of elastic material softer than the segment may be used.

The planarization is preferably carried out with supplying polishing liquids 8 and 9, that are different from each other, from at least two polishing liquid supplying systems 6 and 7 respectively, which different polishing liquids 8 and 9 have the same composition, but have different contents of at least any one component contained in the composition from each other.

The preferable property of the grindstone is the same as that described hereinabove.

Furthermore, to achieve the second object, an apparatus for manufacturing a semiconductor device is provided with a rotating platen, a polishing tool fixed to the rotating platen, a dressing means for dressing the surface of the polishing tool, at least two series of polishing liquid supply systems, a pressing means for holding a substrate and exerting a polishing load on the substrate, and a moving means for relatively moving the polishing tool and the substrate, wherein the polishing tool is a grindstone comprising abrasive that is bonded together with resin and containing pores, the grindstone is provided with a plurality of arranged polygonal segments that are smaller than the substrate, and the rotating platen and the dressing means can be positioned with reference to the standard plane.

The segments fixed on a base plate is preferably used. The plurality of polygonal segments are preferably arranged so that corners of three or more polygonal segments are not located near each other. The preferable property of the grindstone is the same as that described hereinabove.

Furthermore, to achieve the second object, an apparatus for manufacturing a semiconductor device in accordance with the present invention is provided with a rotating platen, a polishing tool fixed to the rotating platen, a dressing means for dressing the surface of the polishing tool, at least two series of polishing liquid supply systems, a pressing means for holding a substrate and exerting a polishing load on the substrate, and a moving means for relatively moving the polishing tool and the substrate, wherein the polishing tool is a grindstone comprising abrasive that is bonded together with resin and containing pores, and provided with a plurality of arranged polygonal segments that are smaller than the substrate.

The segments fixed on a base plate may be used, or the segments fixed on a base plate with interposition of a cushion 43 formed of elastic material softer than the segment may be used. In the case of the former, the rotating platen and the dressing means that are positioned with reference to the standard plane may be preferably used, and on the other hand in the latter case, the given cutting depth dressing means may be used preferably as the dressing means.

The plurality of polygonal segments are preferably arranged so that corners of three or more polygonal segments are not located near each other. The planarization is preferably carried out with supplying polishing liquids 8 and 9, that are different from each other, from at least two polishing liquid supplying systems respectively, which different polishing liquids 8 and 9 have the same composition, but have different contents of at least any one component contained in the composition from each other. The preferable property of the grindstone is the same as that described hereinabove.

BRIEF DESCRIPTION OF THE DRAWINGS

Preferred embodiments of the present invention will be described in detail based on the following, wherein.

DETAILED DESCRIPTION OF THE PREFERRED EMBODIMENTS (First Embodiment)

Figure 2:
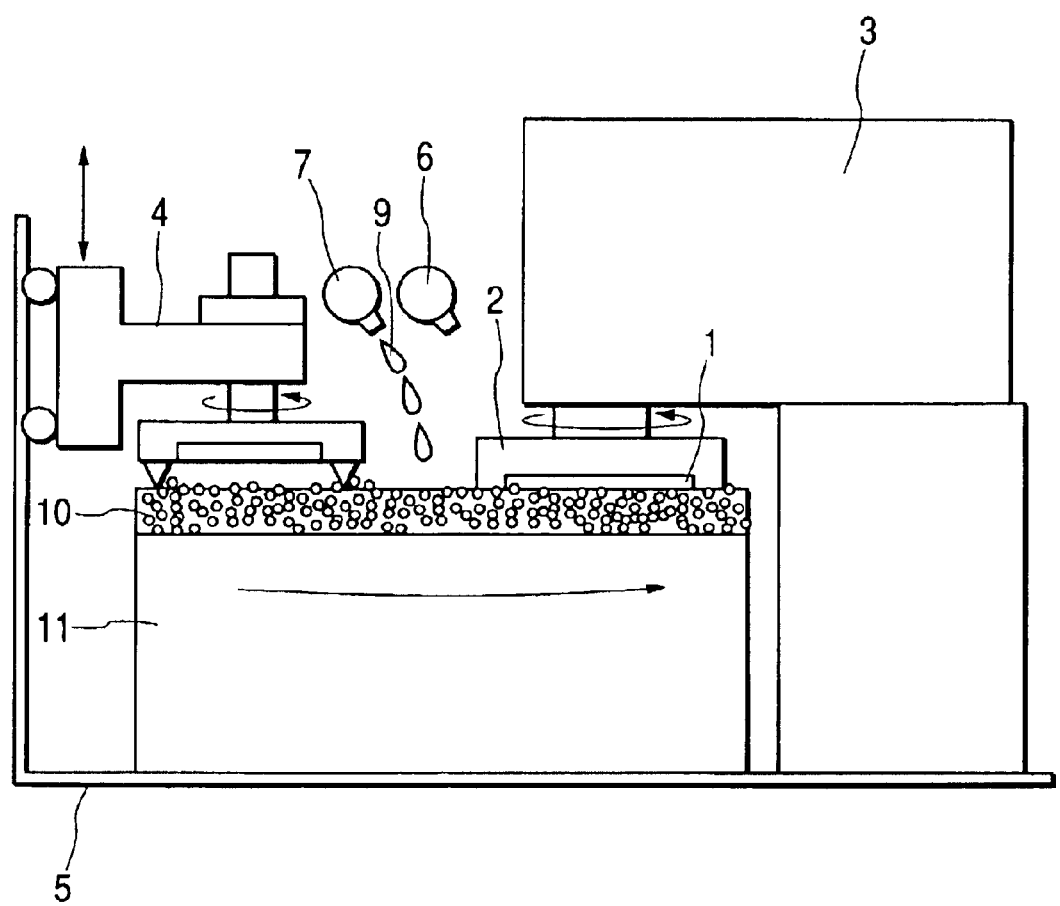
FIG. 2 is an explanatory diagram showing an apparatus structure used in the present invention.

A planarization apparatus (semiconductor device manufacturing apparatus) used for applying the present invention will be described with reference to FIG. 2. A grindstone 10 is fixed on a rotating platen 11, and a head 2 for holding a wafer 1 is provided above the grindstone 10. The head 2 that is positioned by a swing arm 3 functions to hold a wafer with rotation in the same direction as the rotating platen 11, and functions to press and load a predetermined force on the wafer surface. Polishing liquid 9 is supplied drop-wise from a polishing liquid supply system 7. Two sets of polishing liquid supply systems 6 and 7 are provided in the present invention as shown in FIG. 2. The polishing liquid supplied from the two supply system sets can be changed and the flow rate can be controlled separately. In addition to the above, the apparatus is provided with a given cutting depth dresser 4 that dresses the surface of the grindstone 10 smooth. The given cutting depth dresser functions to position the tip at the distance apart from the grindstone surface with reference to the standard plane 5 of the apparatus to thereby cut a predetermined depth. The given cutting depth dresser is provided with a cup-type dresser on which diamond abrasive is adhered, and rotates at a rotation speed as high as 7000 to 10000 rpm. The diamond abrasive (Moh's hardness of 10) is used because it is sufficiently harder than the target surface of the fixed abrasive 10 and no wearing and no chip are required. As a matter of course, the dresser is structured so that the entire both surfaces of the grindstone are planarized.

Figure 3A:
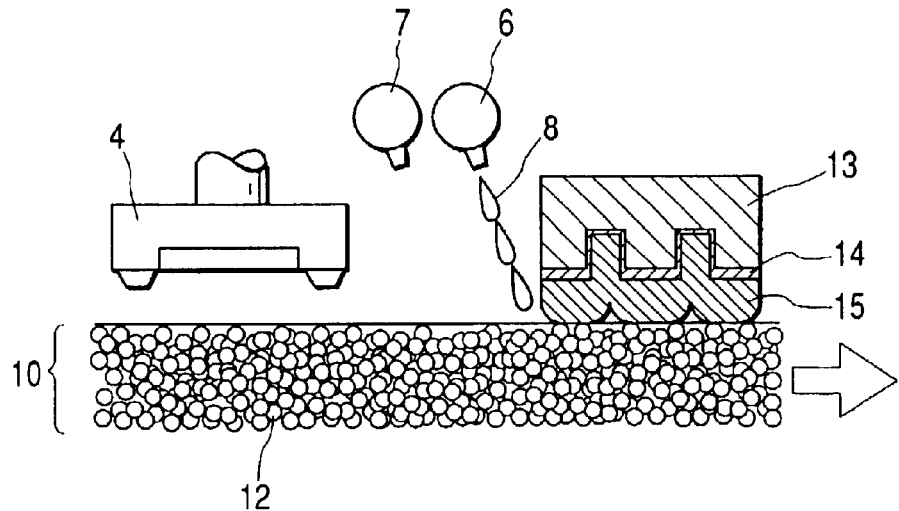
FIG. 3A to FIG. 3C are explanatory diagrams showing a polishing process in accordance with the present invention.
Figure 3B:
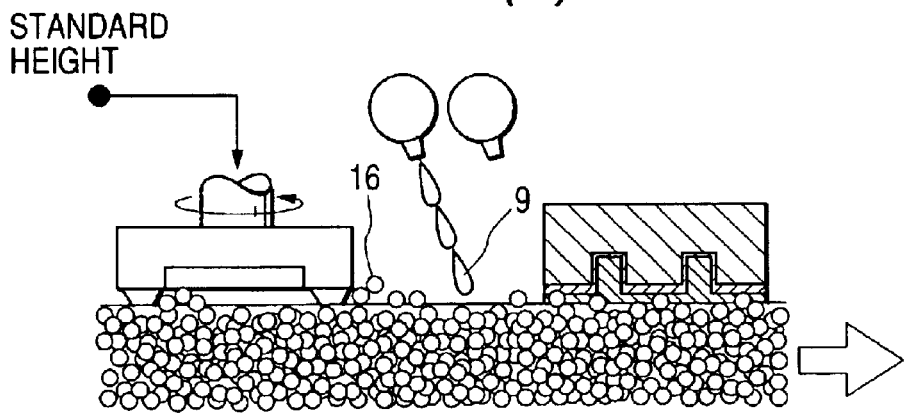
Figure 3C:
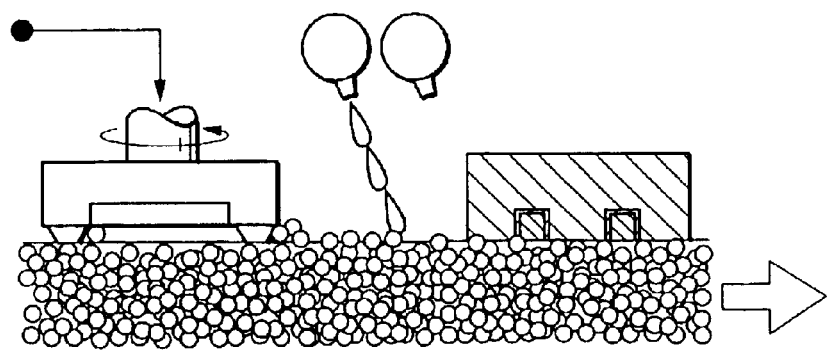

The cross sectional structure of a target wafer 1 will be described with reference to FIG. 3A to FIG. 3C. In FIG. 3A to FIG. 3C, the silicon portion of the wafer substrate is omitted, and only the structure of an oxide film 13, barrier metal film 14, and copper 15 is shown. The oxide film may be a low dielectric material other than silicon oxide film, or may be a laminate of an oxide film and low dielectric material film. A wiring trench is formed on the oxide film 13, and the barrier metal film 14 and copper film 15 are formed thereon. The initial configuration of the substrate surface is not planar before planarization as shown in FIG. 3A. The surface of the copper 15 is removed until the oxide film is exposed as shown in FIG. 3C. After this planarization, the copper in the trench formed of the oxide film remains as it was. In the case of the conventional CMP, polishing work is stopped temporarily at the stage when the barrier metal film 14 is exposed as shown in FIG. 3B starting from the initial configuration shown in FIG. 3A or at the stage just before the barrier metal film 14 is exposed, and the target is transferred to another rotating platen, on which planarization work is continued with supplying a slurry that removes the barrier metal film relatively faster than copper drop-wise until the target attains to the configuration shown in FIG. 3C.

The dressing will be described here in under. In the stage shown in FIG. 3A, the abrasive on the surface of the grindstone 10 falls concomitantly with polishing of copper or the fixing resin surrounds the abrasive to cause a kind of dulling. As the result, the effective abrasive density for polishing the abrasive surface decreases. A means for restoring the abrasive density to the initial state is the given cutting depth dresser 4. The given cutting depth dresser 4 is structured so that the height position apart from the absolute height standard position is controllable, and it is possible to position to the surface height of the grindstone 10 and to cut the grindstone by a predetermined depth. The given cutting depth dresser 4 is operated at the stage shown in FIG. 3B and, the grindstone is cut, for example, by about one micrometer, as the result the abrasive surface without dulling is obtained and the barrier metal film is removed at a predetermined removal rate. The planarization is completed at the time point when the barrier metal film 14 on the surface is removed finally (FIG. 3C).

In the present invention, the above-mentioned series of polishing steps are carried out on the same grindstone 10. Next, a method for manufacturing the grindstone 10 will be described. As a matter of course, a grindstone used in the present invention is by no means limited to the grindstone manufactured by means of the method described herein under.

At first, the first method is described. 0.37 kg of polyester base resin (for example, bisphenol base unsaturated polyester resin liquid) is mixed and stirred with 1.23 kg of fumed silica (for example, Aerosil 50, average particle diameter of 30 nm, product of Nippon Aerosil Co., Ltd.) and 19 g of peroxide, the mixture is cast in a predetermined mold and pressed so that the volume is compressed to 2.5 liters. After pressing, the mixture is heated at 80 to 150° C. for 1 to 3 hours for hardening reaction. The hardened mixture is taken out from the mold, and then further heated at 150 to 300° C.

for 1 to 6 hours to complete the hardening reaction as required. In this case, a predetermined property can be attained by changing the quantity of abrasive, the quantity of resin, or degree of pressing, or by adding microcapsule.

The compressive elastic modulus of the grindstone of the above-mentioned composition is 600 MPa, the tensile breaking elongation is 0.7%, the tensile breaking strength is 2.1 MPa, and the porosity is 65% by volume.

Next, the second method is described. 0.6 kg of polyester base resin (for example, diallylphthalate resin powder) is mixed with 3.0 kg of colloidal silica (for example, Snowtex ZL, average particle diameter of 70 nm, solid component of 40% by weight, product of NISSAN CHEMICAL INDUSTRIES, LTD.), 0.18 kg of pore material (for example, starch or corn starch) and 17.5 g of peroxide are added to the mixture, and fill up to 3.0 liters with water. The mixed suspension is further mixed and stirred, and cast in a predetermined mold, and then heated at 40 to 90° C. for 24 to 48 hours for hardening reaction. The heated product is taken out from the mold, unreacted composition and catalyst are washed off with water and the product is dried as required. After drying, the product is hardened by heating at 100 to 300° C. for 1 to 6 hours to complete the reaction. In this case, it is possible to attain the predetermined property by changing the quantity of abrasive and the quantity of resin.

The compressive elastic modulus of the grindstone of the above-mentioned composition is 720 MPa, the tensile breaking elongation is 0.25%, the tensile breaking strength is 1.0 MPa, and the porosity is 65% by volume.

The procedure for measurement of a grindstone will be described herein under. The compressive elastic modulus is measured according to the compression test method of plastic described in JIS K7208-1995, the tensile breaking elongation and the tensile breaking strength are measured according to the tensile test method of plastic described in JIS K7113-1995 by use of a Tensilon UCT-5T, product of A&D Corp.

Figure 1:
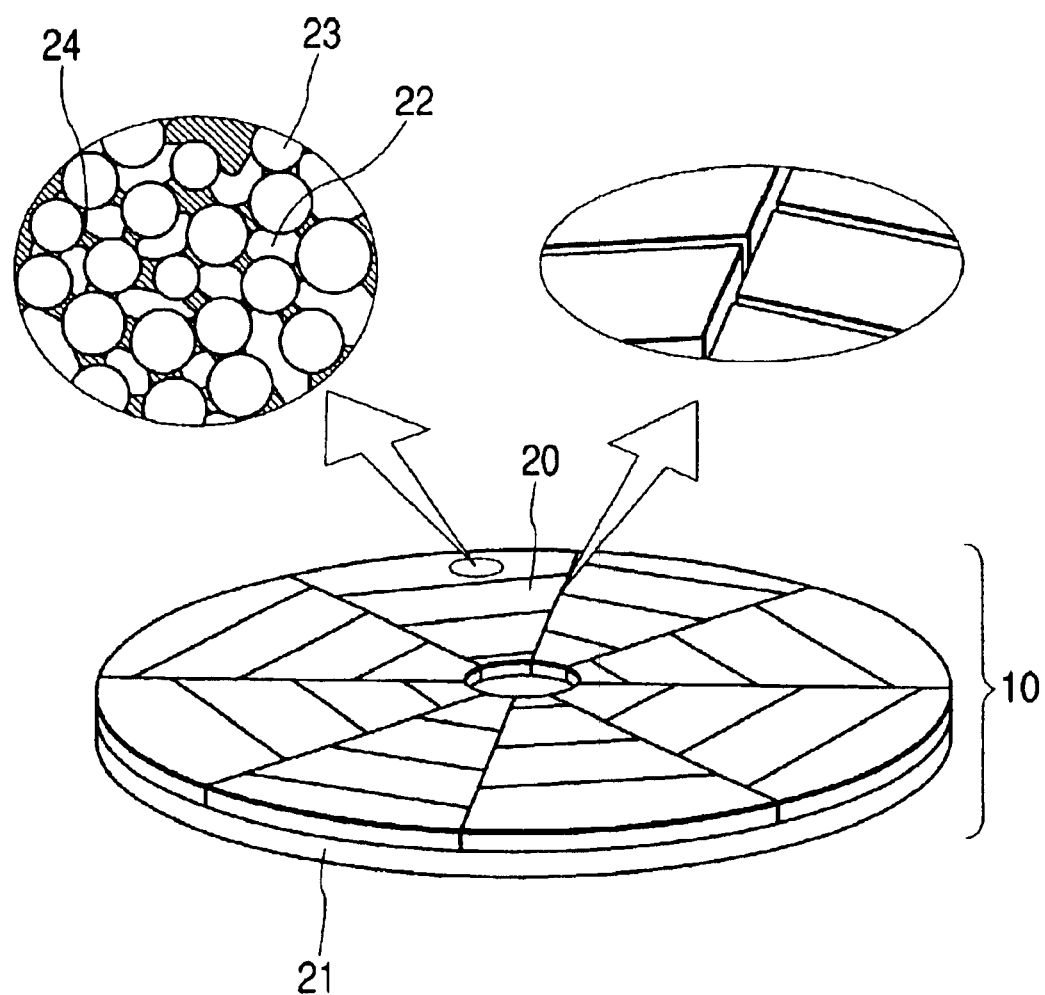
FIG. 1 is an explanatory diagram showing a grindstone in accordance with the present invention.

The structure of the obtained grindstone is shown in FIG. 1. Polygonal segments 20 that are smaller than a wafer 1 are fixedly adhered on a base plate 21. It is necessary that the segment is smaller than a wafer. The smaller segment brings about accelerated expulsion of abrasive dust generated during polishing, smooth supply of polishing liquid, and prevention of absorption of wafer on the grindstone surface. The grindstone segment 20 is apt to be chipped during operation disadvantageously because the tensile breaking strength is not so high as 5 MPa as described hereinabove. If the grindstone segment is chipped, it becomes difficult to polish the wafer surface planar, and the chipped grindstone segment causes scratches. Therefore, it is important to design the grindstone segment that is not chipped while the excellent grinding performance is maintained. In this case, segments 20 are arranged coaxially so that a corner of each segment 20 is not coincident with a corner of other segments 20 as shown in FIG. 1. In other words, corners of three or more segments are not neighbored. In the above-mentioned arrangement of segments 20, a corner that is most apt to be chipped is protected by a neighbored segment 20 preferably. As for segments that neighbor in the circumferential direction, the segment position from the center is deviated by ½ height of a trapezoidal segment, and such arrangement brings about improved even polishing effect. The deviation may not be so large as described hereinabove. Neighbored segments in the circumferential direction of the base plate 21 may be arranged so that the radial position of one side in the circumferential direction of each segment is deviated from that of other segments preferably.

It is apparent that the exemplary arrangement described hereinabove is only an example. As long as the above-mentioned condition is satisfied, various configurations and combinations may be employed.

An enlarged schematic view of the surface of a segment 20 is shown on the upper left corner. The grindstone comprises abrasive 23 that is fixedly adhered with the resin 24 and contains pores 22. It is required for the grindstone 10 to polish copper and the barrier metal film without flawing the oxide film. The hardness of the abrasive 23 is preferably equal to or harder than that of the barrier film material and equal to or softer than that of the oxide film. For example, the Moh's hardness of the barrier metal film consisting of Ta is 6.5 and that of the oxide film (silicon oxide film) is 7. Therefore, the silica abrasive (Moh's hardness of 7) satisfies the above-mentioned requirement. Fumed silica or colloidal silica is preferably used as the silica abrasive because these materials are not involved in scratch problem and impurity problem. Effective action of the silica abrasive on the barrier metal film brings about excellent planarization. Furthermore, the abrasive having the average particle diameter of 100 nm or smaller does not cause scratch problem. Furthermore, the average particle diameter of the abrasive is preferably 10 nm or larger.

Figure 4:
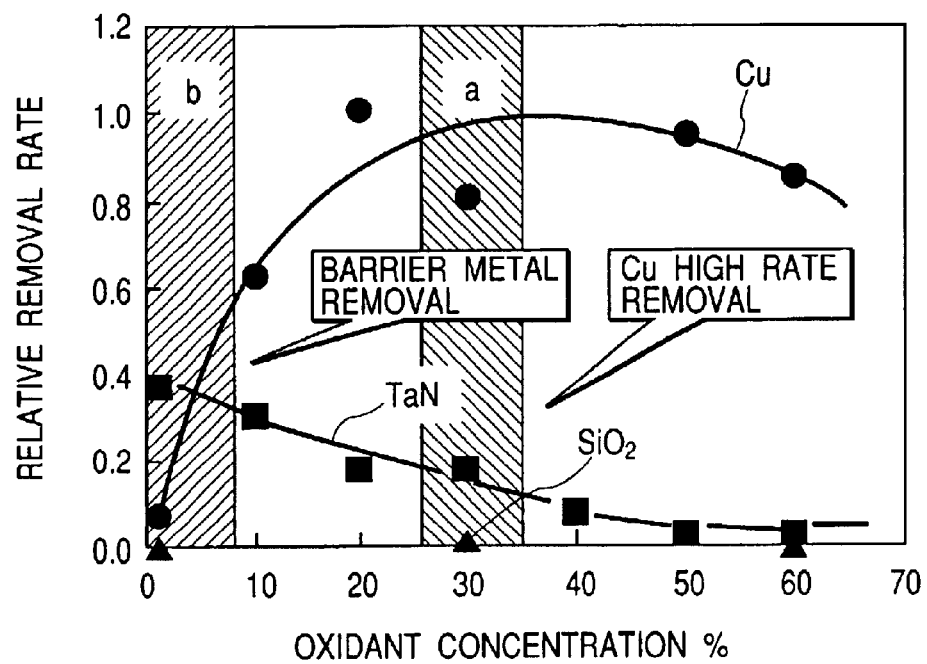
FIG. 4 is a diagram showing the relation between the ingredient concentration and the relative removal rate in accordance with the present invention.

The above-mentioned grindstone 10 is attached to the planarization apparatus shown in FIG. 2, and the surface of the grindstone 10 is dressed by means of the given cutting depth dresser 4. The planarity of the grindstone surface is approximately 10 μm, and abrasive is exposed on the grindstone surface. As shown in FIG. 3A, a wafer is polished with supplying the polishing liquid 8 on the grindstone surface. At that time, the given cutting depth dresser 4 is resting at the position apart from the grindstone 10. The polishing liquid contains an oxidant, an organic acid, an anticorrosive, and pure water. In this case, the polishing liquid comprises 30% of hydrogen peroxide solution (concentration of 30%) as the oxidant, 0.15% of malic acid as the organic acid, and 0.2% of benzotriazol (BTA) is used. The relation between the hydrogen peroxide concentration and the removal rate for each material is shown in FIG. 4 with black circles. As shown in FIG. 4, the removal rate is maximized at the concentration of approximately 30% (region (a)). The above-mentioned polishing liquid brings about short working time that is the time required to polish one wafer, and the through-put is improved desirably.

When removal of copper proceeds to the state shown in FIG. 3B, the polishing liquid 8 is replaced with the polishing liquid 9. In this embodiment, the supply system 6 of the polishing liquid is stopped and the polishing liquid 9 is supplied from the polishing liquid supply system 7. The composition of the polishing liquid 9 is the same as that of the polishing liquid 8, that is, the polishing liquid 9 contains an oxidant (aqueous hydrogen peroxide solution), an organic acid (malic acid), and an anticorrosive (BTA). The concentration of the polishing liquid 9 used in the step shown in FIG. 3B is adjusted so that the removal rate of the copper is approximately equal to that of the barrier metal film ((b) region shown in FIG. 4) The oxidant concentration is adjusted and the given cutting depth dresser 4 is used to equalize the removal rate of the copper to that of the barrier metal film. The above-mentioned operation prevents the copper and oxide film from being excessively removed so as not to cause dishing or erosion.

The given cutting depth dressing in the step shown in FIG. 3B means the operation in which the given cutting depth dresser 4 is lowered to the surface height of the grindstone 10 so that the diamond abrasive is brought into contact with the grindstone surface to remove the dulled surface layer of the grindstone and to expose the new abrasive surface and generate free abrasive 16 concomitantly. The positioned height of the given cutting depth dresser may be the same position as that positioned for dressing before planarization, or may be at the position for cutting further about 1 μm. The cutting causes generation of lot of free abrasive 16, and the removal rate of the barrier metal film 14 is improved.

The process is ended when the barrier metal film has been removed and the oxide film is exposed. At that time, the removal rate of the oxide film that is very slower than that of the barrier metal film and the copper is effective to prevent the removal of the film due to over polishing desirably. Furthermore, it is possible to prevent insufficient polishing by setting the operation time longer even if the wafer surface is uneven. For example, the operation time may be 1.3 to 1.5 times the just polishing time wherein the just polishing time means the polishing time required to remove the barrier metal film on the target surface mostly.

(Second Embodiment)

A grindstone 10 that contains hollow microcapsules in addition to abrasive is effective for chemical liquid retention and for fast removal rate. Furthermore, the above-mentioned grindstone is also effective for even distribution of chemical liquid concentration on entire surface of the grindstone.

Generally, chemical liquid is not apt to penetrate into a wafer on the center region, and polishing rate distribution on a wafer is slower as the position is nearer to the center. The reason is that chemical liquid is supplied not sufficiently on the center region in comparison with peripheral region of a wafer. To solve this problem, closed pores are formed on the grindstone surface so that chemical liquid is retained in the closed pores. Hollow microcapsule is effective as the means to realize the above-mentioned retention of chemical liquid. In this embodiment, the grindstone contains 30% by volume of microcapsule having the average particle diameter of 43 μm. The removal rate of copper and TaN barrier metal film increases by 50% or more when the grindstone is used for planarization.

In the above, the hollow portion of the microcapsules is not included in the range of the above-mentioned porosity. If the hollow portion of the microcapsules is added to the above-mentioned porosity, it is preferable that the total porosity value does not exceed 80%.

(Third Embodiment)

Figure 5:
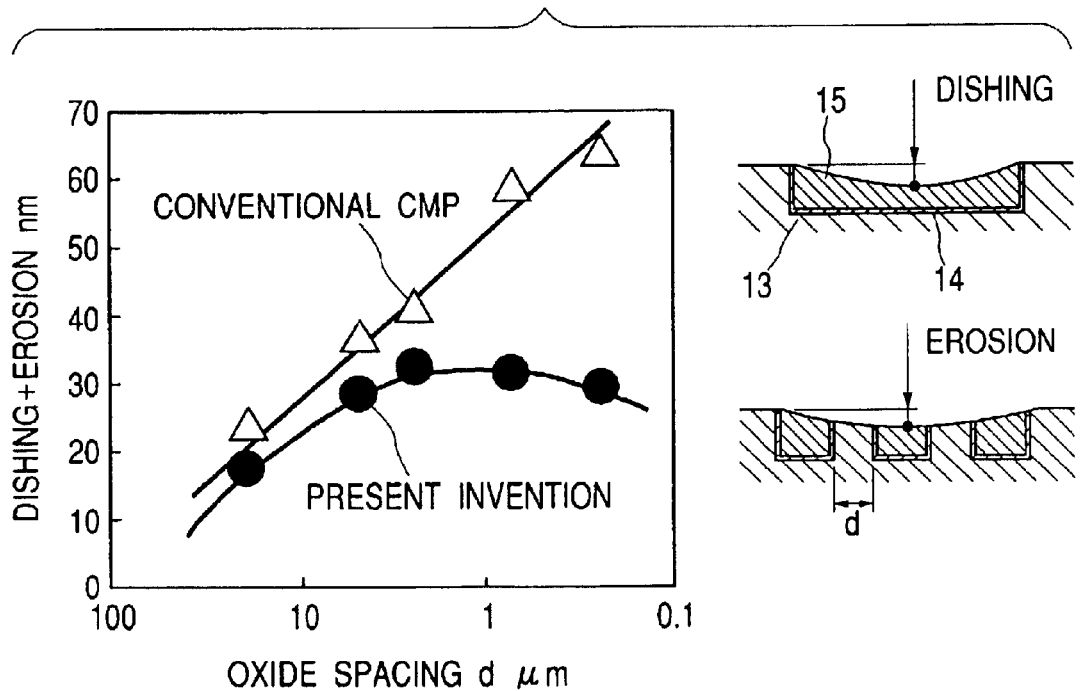
FIG. 5 is a diagram showing the planarization performance in accordance with the present invention.

A wafer with pattern is processed with application of the above-mentioned planarization technique to obtain the result shown in FIG. 5. A pattern, so called line&space having a line width of 20 μm, on which a plurality of copper wiring are arranged with certain intervals is used. The abscissa represents the oxide film interval d and the ordinate represents the sum of dishing and erosion. FIG. 5 demonstrates the high planarization in comparison with the conventional CMP. The high planarization is attributed to the grindstone having the compressive elastic modulus 2 to 30 times higher (200 MPa to 3 GPa) than the conventional CMP pad.

Figure 6:
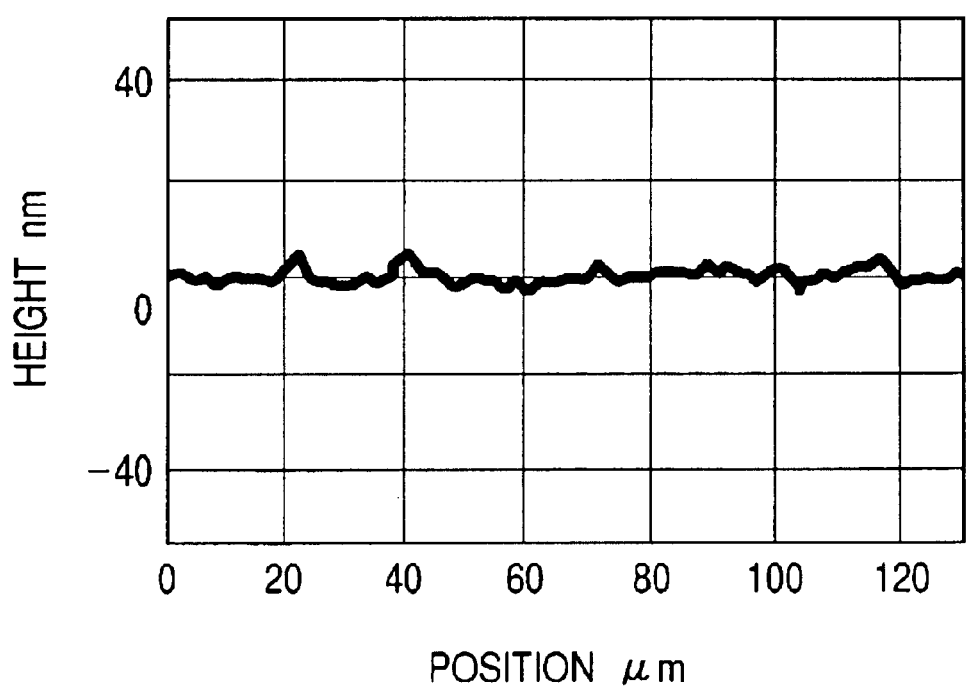
FIG. 6 is a diagram showing the copper surface configuration after planarization in accordance with the present invention.

The scratching is one of the problems that arise from planarization by use of a hard grindstone. The grindstone of the present invention contains fine abrasive of high purity fumed silica or colloidal silica that is distributed and bonded homogeneously, and does not contain foreign matter or large diameter particles that cause scratching. Furthermore, because the given cutting depth dresser makes the grindstone surface planar before polishing and eliminates dulling and loading, a wafer is processed without scratching. FIG. 6 shows the measurement result of the surface configuration of a copper square having a side length of 120 μm after polishing. The height of convex/concave on the surface is 10 nm or lower, the copper surface is sufficiently planar like mirror surface for using as wiring of a semiconductor.

(Fourth Embodiment)

Figure 7:
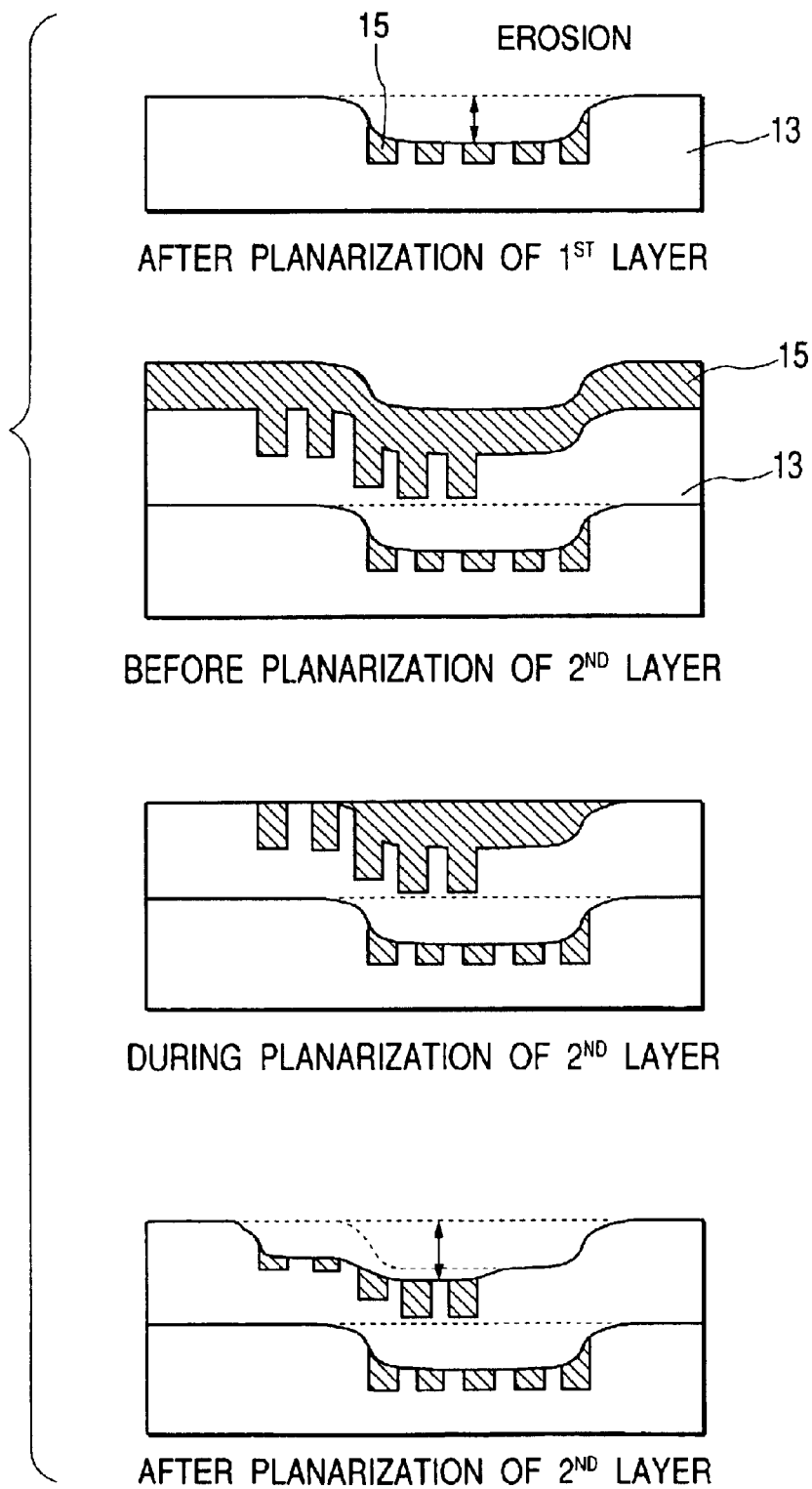
FIG. 7 is a partial schematic cross sectional view of a semiconductor device for describing the planarization performance.
Figure 8:
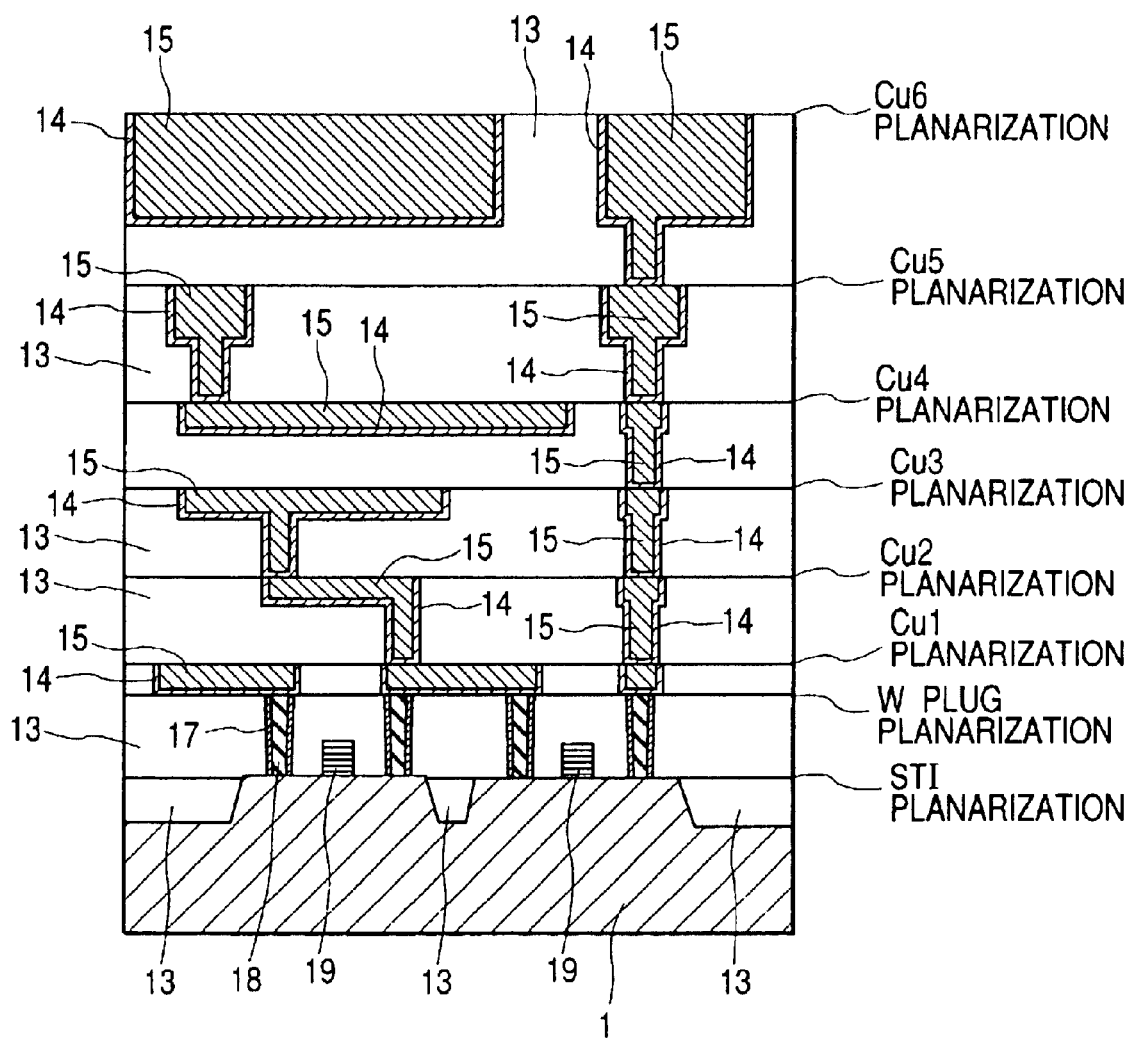
FIG. 8 is a schematic cross sectional view of the multi-layer wiring structure.

Next, the embodiment in which the present invention is applied to a semiconductor device actually will be described with reference to FIG. 8. FIG. 8 is a cross sectional view of a multi-layer logic device having six layers. A shallow trench isolation (STI) is formed on the surface of a silicon wafer substrate 1 by means of oxide film planarization technique, and then a transistor having gate patterns 19 is formed. Thereafter, a W contact plug 18 for connecting to upper wiring layers is formed by means of W planarization technique. A barrier metal film 17 is formed on the interface between the W plug 18 and an insulation film as in the case of the copper wiring structure. The upper layers disposed above the W plug are all copper wiring layers, and all the six layers are formed according to the present invention. Because the under layer is planar, the copper layers are planarized without insufficient removal, dishing, and erosion as described referring to FIG. 7. As a matter of course, a planar semiconductor device can be manufactured by applying planarization with fixed abrasive to STI layer and W plug planarization. For example, Japanese Patent Laid-open No. 2000-49122 discloses STI layer planarization by use of fixed abrasive.

(Fifth Embodiment)

Figure 9:
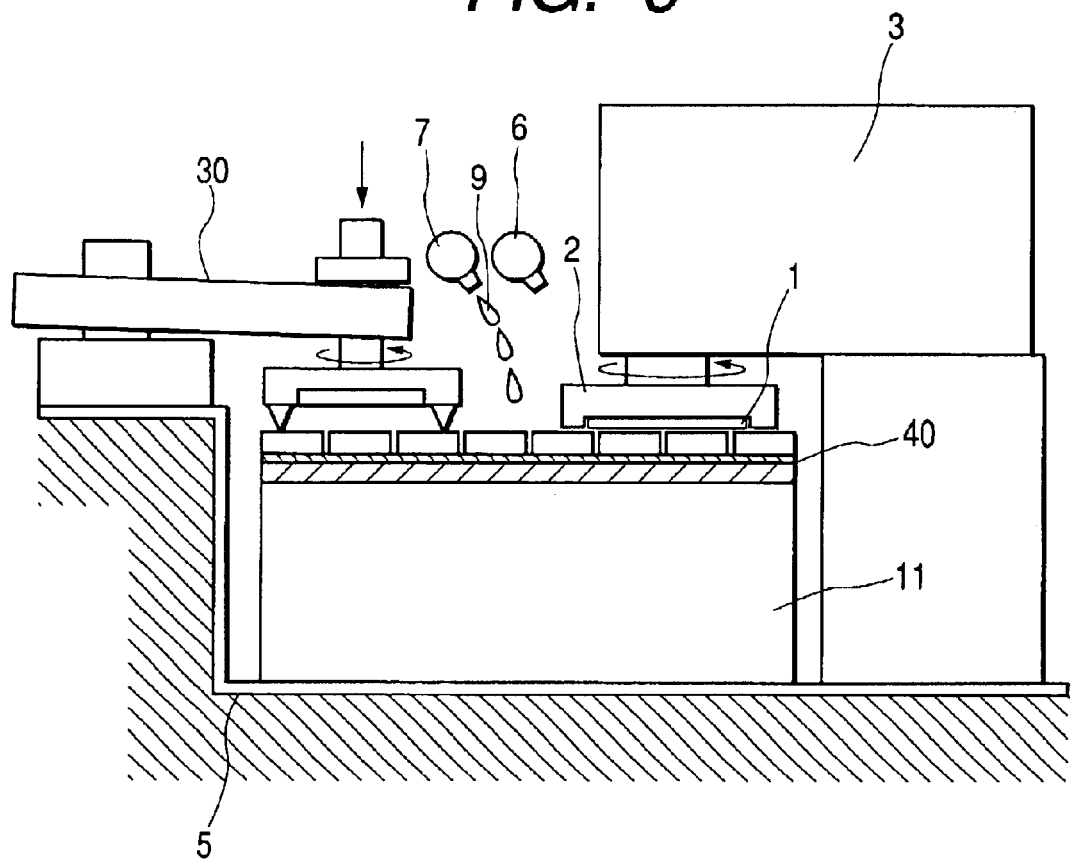
FIG. 9 is an explanatory diagram of a CMP apparatus provided with a given pressure dresser to which a grindstone having the multi-layer structure is applied.
Figure 10:
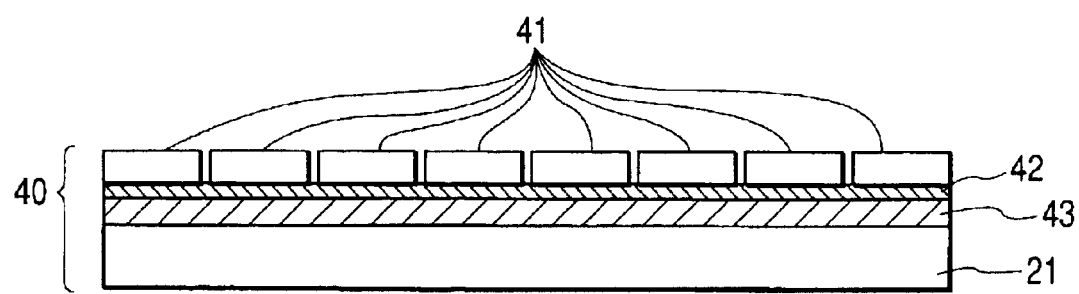
FIG. 10 is a schematic cross sectional view showing the structure of a grindstone having the multi-layer structure in accordance with the present invention.
Figure 11:
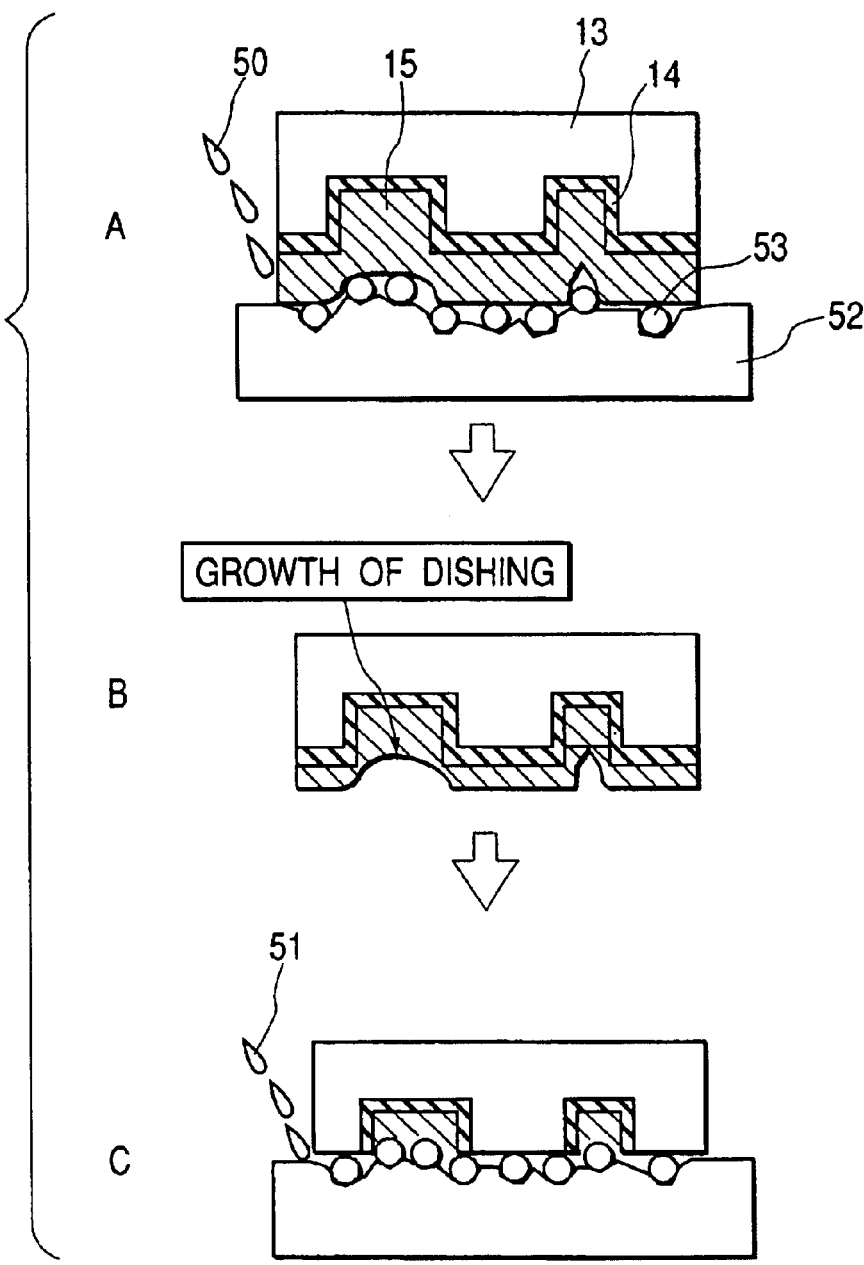
FIG. 11A to FIG. 11C are explanatory diagrams showing a conventional planarization method.

The above-mentioned embodiments including the fourth embodiment describe the exemplary planarization in which the given cutting depth dresser 4 that can cut a certain depth is used as a dresser. This embodiment will describe an exemplary application to a CMP apparatus provided with a constant pressure dresser 30 that dresses keeping a certain constant pressure, which is used usually. FIG. 9 shows a conventional rotating platen type CMP apparatus provided with a constant pressure dresser 30. A multi-layer grindstone 40 of the present invention is mounted on the CMP apparatus instead of a conventional polishing pad. Because of the high compressive elastic modulus of the grindstone 10 shown in FIG. 2, it is required that the surface is dressed planar sufficiently, and the given cutting depth dresser is required. In this embodiment in which a multi-layer grindstone 40 is used, a cushion 43 is placed on a base plate 21 and a film 42 is fixed thereon as shown in FIG. 10. Abrasive segments 41 are fixed on the film 42. The cushion 43 may be formed of an elastic material that is softer than that of the abrasive segments 41. In this embodiment, a polyurethane foam sheet is used. The film 42 fixed thereon is an interposed member that functions to connect the moving of each segment abrasive 41 smoothly when the segments are loaded on the multi-layer grindstone and to prevent chipping of the grindstone when the wafer 1 or the constant pressure dresser 30 collide on the corner of the grindstone segments 41. The constant pressure dresser is a means that functions to tooth the pad surface with pressing the dresser on the polishing pad with a constant pressure, but does not function to position the dresser height at a desired position differently from the given cutting depth dresser. Furthermore, the configuration and arrangement of the segment abrasive 41 may be the same as those of the grindstone segments as shown in FIG. 1. As a matter of course, a multi-layer grindstone 40 may be mounted on the apparatus that is provided with the given cutting depth dresser.

The above-mentioned multi-layer structure can absorb load because of deformation of the cushion under layer 43 even if the surface height configuration of each segment abrasive 41 is uneven, as the result the problem of uneven planarity and scratching is avoided. Furthermore, this embodiment is characterized in that the present invention can be applied to a CMP apparatus that has been already introduced.

The rotating platen 11 and the constant pressure dresser of a conventional planarization apparatus rotates in the same direction. However, the structure having the rotating platen 11 and the constant pressure dresser rotating in different directions from each other brings about not only planar dressing of the surface of the laminate type grindstone 40 after dressing but also long service life of the multi-layer grindstone 40.

The conventional CMP process has required two or more steps for removing the barrier metal film, however, according to the present invention, the CMP process requires only one step for planarization. The shortened process brings about increased wafer processing per unit time, and the through-put is improved. Furthermore, the use of high compressive elastic modulus grindstone brings about reduced dishing and erosion, though conventional planarization technique is involved in the problem of dishing and erosion. The present invention also brings about improved yield because the dispersion of wiring resistance value is reduced and disconnection failure is reduced.

What is claimed is:

1. A method for manufacturing a semiconductor device comprising:
    a step for forming a first conductive film on an aperture of an insulation film provided on a substrate and on the insulation film surface;
    a step for forming a second conductive film on the first conductive film; and
    a step for grinding the portion of the second conductive film and the first conductive film by use of a grindstone with reserving the first conductive film and the second conductive film in the aperture residually,
    wherein the grindstone comprises abrasive that is bonded together with resin and contains pores, and
    wherein the grindstone is provided with a plurality of coaxially arranged polygonal segments that are smaller than the substrate, and the segments are arranged so that an inner-side segment is smaller than an outer-side segment.

2. The method for manufacturing a semiconductor device according to claim 1, wherein the compressive elastic modulus of the grindstone is in a range from 200 MPa to 3 GPa.

3. The method for manufacturing a semiconductor device according to claim 2, wherein the porosity of the grindstone is in a range from 35 to 75%, the tensile breaking elongation of the grindstone is in a range from 0.2 to 1.5%, and the tensile breaking strength of the grindstone is in a range from 0.5 to 5 MPa.

4. The method for manufacturing a semiconductor device according to claim 1, wherein the porosity of the grindstone is in a range from 35 to 75%.

5. The method for manufacturing a semiconductor device according to claim 1, wherein the abrasive is at least any one of fumed silica and colloidal silica, and the resin is at least any one of polyester base resin and polyimide base resin.

6. The method for manufacturing a semiconductor device according to claim 1, wherein the average particle diameter of the abrasive is in a range from 10 nm to 100 nm.

7. The method for manufacturing a semiconductor device according to claim 1, wherein the grindstone contains hollow microcapsules.

8. The method for manufacturing a semiconductor device according to claim 1, wherein the segments are arranged so that corners of three or more polygonal segments are not located near each other.

9. The method for manufacturing a semiconductor device according to claim 1, wherein said plurality of coaxially arranged polygonal segments are disposed adjacent to each other in radial and circumferential directions of the grindstone.

10. The method for manufacturing a semiconductor device according to claim 1, wherein said abrasive has a hardness equal to or greater than that of the first conductive film, and equal to or softer than that of the insulation film.

11. The method for manufacturing a semiconductor device according to claim 1, wherein the segments are fixed on a base plate with interposition of a cushion formed of elastic material that is at least softer than the segments.

12. A method for manufacturing a semiconductor device for planarizing convex/concave pattern by means of relative motion between a polishing tool and a substrate having the convex/concave pattern on the surface on which at least a portion of a semiconductor element is formed with pressing the convex/concave pattern on the polishing tool, wherein the polishing tool comprises a grindstone provided with a plurality of coaxially arranged polygonal segments that are smaller than the substrate and that are arranged so that corners of three or more polygonal segments are not located near each other.

13. The method for manufacturing a semiconductor device according to claim 12, wherein the segments are fixed on a base plate with interposition of a cushion formed of elastic material that is at least softer than the segment.

14. The method for manufacturing a semiconductor device according to claim 12, wherein the planarization is carried out with supplying polishing liquids, that are different from each other, from at least two polishing liquid supplying systems, which different polishing liquids have the same composition, but have the content of at least any one component contained in the composition different from each other.

15. The method for manufacturing a semiconductor device according to claim 12, wherein the porosity of the grindstone is in a range from 35 to 75%.

16. The method for manufacturing a semiconductor device according to claim 12, wherein the compression elastic modulus of the grindstone is in a range from 200 MPa to 3 GPa, the tensile breaking elongation of the grindstone is in a range from 0.2 to 1.5%, and the tensile breaking strength of the grindstone is in a range from 0.5 to 5 MPa.

17. The method for manufacturing a semiconductor device according to claim 12, wherein said plurality of coaxially arranged polygonal segments are disposed adjacent to each other in radial and circumferential directions of the grindstone.

* * * * *